United States Patent
Miyagi et al.

(10) Patent No.: US 6,217,319 B1
(45) Date of Patent: Apr. 17, 2001

(54) SEMICONDUCTOR MANUFACTURING DEVICE AND METHOD OF PROCESSING WAFER

(75) Inventors: Tadashi Miyagi; Yoshiaki Yamada; Takayuki Saito, all of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/088,702

(22) Filed: Jun. 2, 1998

(30) Foreign Application Priority Data

Dec. 3, 1997 (JP) .................................................. 9-332584

(51) Int. Cl.$^7$ ...................................................... F27B 5/16
(52) U.S. Cl. .......................... 432/200; 432/144; 432/152; 432/192; 118/715
(58) Field of Search ..................................... 432/200, 201, 432/144, 152, 192; 118/715, 724, 725

(56) References Cited

U.S. PATENT DOCUMENTS

| | | | |
|---|---|---|---|
| 3,841,614 | * 10/1974 | Okuno | 432/171 |
| 4,556,785 | * 12/1985 | Blechschmid et al. | 432/121 |
| 5,817,178 | * 10/1998 | Mita et al. | 118/724 |
| 6,002,108 | * 12/1999 | Yoshioka | 219/388 |

FOREIGN PATENT DOCUMENTS

| | | |
|---|---|---|
| 63-107116 | 5/1988 | (JP) . |
| 3-163819 | 7/1991 | (JP) . |
| 6-84781 | 3/1994 | (JP) . |

* cited by examiner

*Primary Examiner*—Denise L. Ferensic
*Assistant Examiner*—Gregory A. Wilson
(74) *Attorney, Agent, or Firm*—McDermott & Will & Emery

(57) ABSTRACT

A hot plate unit includes a cover. The cover includes an inner wall and an outlet. There is provided immediately under the outlet a plate having a ventilation hole. The distance between the plate and a main surface is identical to the distance between the main surface and the internal wall face. The hot plate unit has an displacement control valve for restricting displacement at a level in the range from at least 0.1 L/min to at most 1 L/min.

8 Claims, 3 Drawing Sheets

DISTRIBUTION IN WAFER SURFACE

SEMICONDUCTOR MANUFACTURING DEVICE AND METHOD OF PROCESSING WAFER

BACKGROUND OF THE INVENTION

1. Field of the Invention

The present invention relates generally to semiconductor manufacturing devices, and more particularly, to a semiconductor manufacturing device for baking a wafer in the process of photolithography.

2. Description of the Background Art

In the process of photolithography in the manufacture of semiconductor devices, resist is applied on a wafer and patterned into a prescribed shape. At the time, the resist is subjected to various baking processes including dehydration bake (DH), adhesion bake (AD), pre-bake (PB), post-exposure bake (PEB), and post-development bake (PDB).

FIG. 4 shows an example of a semiconductor manufacturing device, a hot plate unit 1 capable of performing the baking processes as described above. Referring to FIG. 4, hot plate unit 1 has a bake plate 3 provided in a chamber 8 and a cover 2. Bake plate 3 is continuously placed in a heated state by a heater, and held at a prescribed temperature. Cover 2 has an outlet 6 and an inner wall face 2c. Hot plate unit 1 is provided with an inlet 9 for taking in gas into chamber 8.

A method of baking using hot plate unit 1 having the above-described structure will be now described. A wafer 7 is placed on bake plate 3 in chamber 8 by a robot arm and the like. At the time, wafer 7 and bake plate 3 are brought into a close contact state or a point-contact state (proximity bake). Chamber 8 is filled with air, DA (Dry Air), $N_2$ and the like. In the state, wafer 7 is subjected to a baking processing for a prescribed time period. During the period, the gas is constantly let out from outlet 6 provided at cover 2 at 2 to 3 L (liter)/min. After wafer 7 has been thus baked, wafer 7 is taken out from chamber 8, and the baking completes.

As described above, conventional hot plate unit 1 is devised to improve the displacement efficiency by providing outlet 6 and inclining the inner wall face 2c of cover 2. The amount of displacement is about as large as 2 to 3 L/min in order to restrict crystallization of a sublimate in chamber 8.

While such a countermeasure to sublimation is important, wafer 7 should be evenly baked as well. This is because how evenly wafer 7 has been baked affects the uniformity of line width or the like on a main surface 7a after patterning.

FIG. 5 shows a distribution of hole sizes (a distribution within a wafer surface) in the main surface 7a of wafer 7 after a hole size reducing process using a thermal flow of resist by conventional hot plate unit 1. As shown in FIG. 5, hole sizes in the central portion of wafer 7 are extremely larger than those in the other parts. This shows that wafer 7 could hardly be evenly baked by conventional hot plate unit 1. This is probably because conventional hot plate unit 1 as described above does not take much into account the effect of air flow within chamber 8 or radiant heat from cover 2. Hence, such conventional hot plate unit 1 cannot be used for a process sensitive to heat treatment, a hole size reducing process in particular.

SUMMARY OF THE INVENTION

The present invention is directed to a solution to the above-described problem. It is an object of the invention to provide a semiconductor manufacturing device which permits wafer 7 to be evenly baked.

A semiconductor manufacturing device according to the present invention directed to baking a wafer, in one aspect, includes a chamber, a heater portion, a cover, an inlet/outlet, and a member having a ventilation hole. The heater portion is placed within the chamber, on which a wafer is placed. The cover has an inner wall face opposite to a main surface of the wafer placed on the heater portion, and the main surface of the wafer and the inner wall face of the cover are separated from each other at a fixed distance. The inlet/outlet is provided at a position opposite to the main surface of the wafer to let in or let out gas. The member having the ventilation hole is provided between the inlet/outlet and the wafer such that the distance from the main surface of the wafer is identical to the distance between the inner wall face of the cover and the main surface of the wafer.

As described above, by fixing the distance between the inner wall face of the cover and the main surface of the wafer, radiant heat may be evenly caused at the main surface of the wafer opposite to the inner wall surface by rays radiated from the inner wall face of the cover. Furthermore, by positioning the member between the inlet/outlet and the wafer at a level almost the same as that of the inner wall face of the cover, radiant heat may be caused on the surface of the wafer opposite to the member by rays radiated from the member. As a result, radiant heat may be generated evenly on the main surface of the wafer, which permits the wafer to be evenly baked. In addition, the member has a ventilation hole through which an appropriate amount of gas may be supplied/exhausted. Thus, crystallization of a sublimate within the chamber may be restricted.

Gas is preferably externally supplied into the chamber. The gas is sent into the chamber via the cover. The cover preferably has a gas path for increasing the temperature of the gas sent into the chamber.

The cover has such a gas path that gas warmed at the time of passing through the path may be sent into the chamber. Thus, the wafer can be prevented from being cooled by the gas coming into the chamber from the outside. This also contributes to even baking of the wafer.

The cover is preferably provided with a first gas path communicating with the inlet/outlet, and a second gas path communicating with the first gas path through the chamber. The second gas path is preferably provided along the first gas path and the inner wall face of the cover.

Thus providing the second gas path along the first gas path and the inner wall face of the cover permits gas allowed into the second gas path to be heated by gas allowed out through the first path and the inner wall face of the cover if the second path is used for example as an inlet path. Thus, gas passing through the second gas path may be heated without additionally providing a heater device. Note that the first gas path and the second gas path may be equally advantageously used as an inlet path and an outlet path, respectively.

The above-described member is preferably a plate having evenly provided ventilation holes. The circumferential portion of the member is preferably connected with the inner wall face of the cover.

Thus evenly providing ventilation holes at the member permits appropriate gas supply/displacement. Thus, an appropriate air flow may be generated in the chamber, and thermoconductivity may be improved while effectively restricting crystallization of a sublimate. Furthermore, connecting the circumferential portion of the member with the inner wall face of the cover permits the member fixed at a position as high as the inner wall face of the cover. Thus, radiant heat may be almost evenly generated at the main surface of the wafer.

In another aspect of the invention, the semiconductor manufacturing device includes an displacement control valve to control the displacement at a level not less than 0.1 L/min and not more than 1 L/min.

Thus controlling the displacement at the level not less than 0.1 L/min and not more than 1 L/min can restrict a variation of hole sizes in the hole size reducing process as shown in FIG. 3. As a result, setting the displacement within the above-described range could largely contribute to even baking of the wafer. Note that if the displacement is set lower than 0.1 L/min, it would be difficult to forcibly generate an air flow within the chamber, which could lead to deposition of a sublimate within the chamber. The displacement is therefore preferably not less than 0.1 L/min.

The semiconductor manufacturing device according to this aspect preferably has a chamber and a cover. The cover is provided with an outlet and gas paths formed around the outlet to let gas into the chamber. A plurality of displacement control valves are provided around the outlet to communicate with the gas paths.

Thus providing the gas paths for letting gas into the chamber around the outlet permits gas to be supplied for example from a plurality of positions into the chamber. If gas paths are provided to surround the outlet, gas may be supplied evenly into the chamber from the vicinity of the sidewall surrounding the chamber. As a result, an appropriate air flow may be forcibly generated within the chamber simply by supplying a small volume of gas into the chamber. This could also advantageously contribute to even baking of a wafer.

A method of processing a wafer according to the present invention uses the semiconductor manufacturing device described above.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
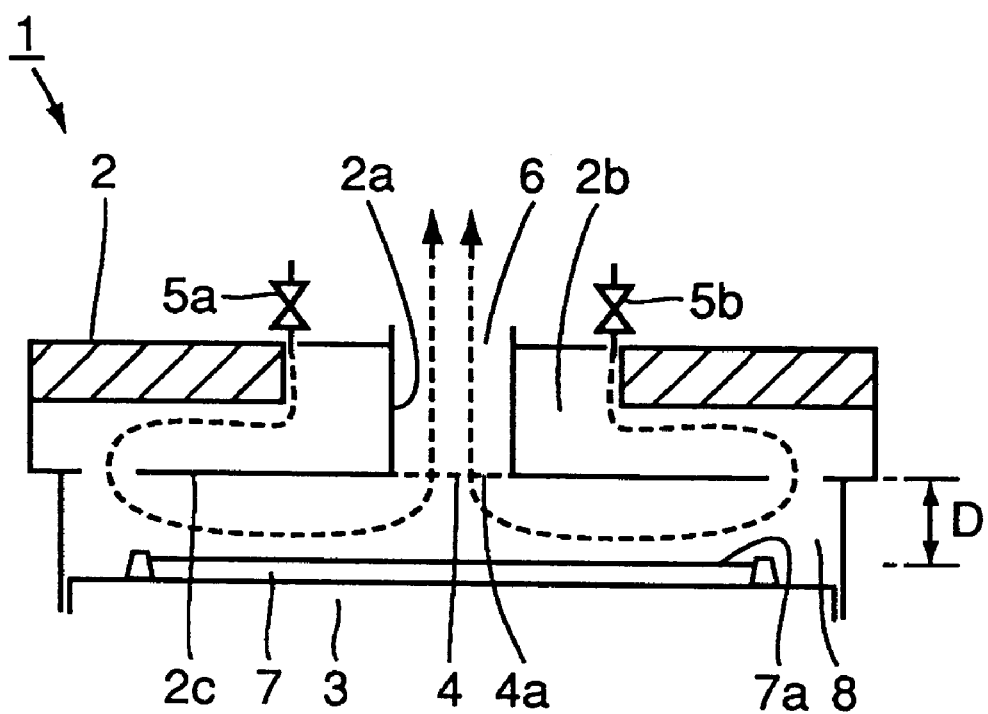
FIG. 1 is a cross sectional view schematically showing a hot plate unit according to one embodiment of the invention.
Figure 2:
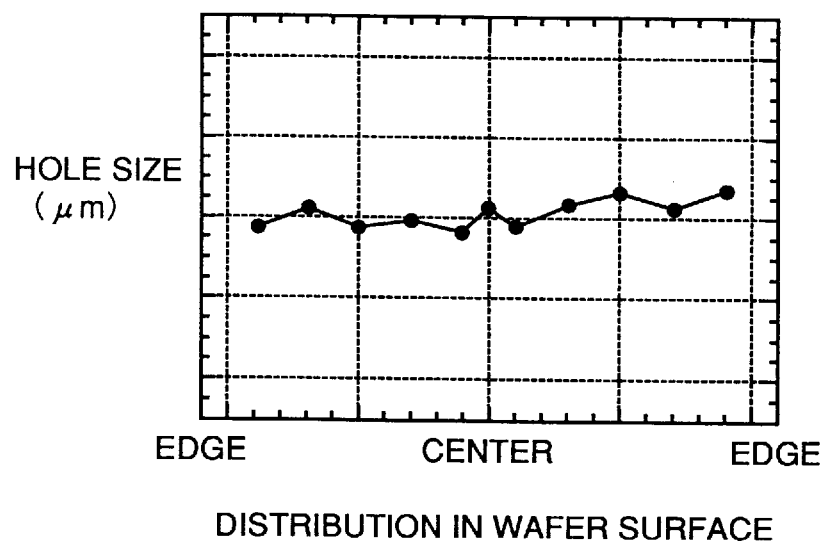
FIG. 2 is a graph showing a distribution of hole sizes at a main surface of a wafer when a hole size reducing process is performed using the hot plate unit shown in FIG. 1.

One embodiment of the invention will be described in conjunction with FIGS. 1 to 3. FIG. 1 is a cross sectional view showing a hot plate unit 1 according to this embodiment.

Referring to FIG. 1, hot plate unit 1 according to the invention includes a cover 2 attached to cover chamber 8, a bake plate 3 placed in chamber 8, and displacement control valves 5a and 5b. Bake plate 3 is maintained at a fixed temperature by a heater, and a wafer 7 is placed on bake plate 3. Cover 2 includes an outlet 6, first and second gas paths 2a and 2b, an inner wall face 2c, and a plate 4.

Outlet 6 is provided at a position opposite to a main surface 7a of wafer 7 which is placed on bake plate 3. In this case, outlet 6 is provided in the center of cover 2 positioned over wafer 7. First gas path 2a extends downwardly from outlet 6 and reaches plate 4.

Second gas path 2b is provided adjacent to first gas path 2a. In this case, second gas path 2b is provided around the first gas path 2a. Second path 2b may be provided to surround the entire circumference of first gas path 2a and a plurality of such second gas paths 2b may be provided. Exhaustion control valves 5a and 5b are provided to communicate with one end of second gas path 2b. The other end of second gas path 2b communicates with a space within chamber 8 positioned in the vicinity of the sidewall of hot plate unit 1 surrounding chamber 8 (hereinafter referred to as "the circumferential portion of chamber 8").

The inner wall face 2c of cover 2 is provided opposite to the main surface 7a of wafer 7 placed on bake plate 3, and the distance D between inner wall face 2c and main surface 7a is adjusted to be fixed. Thus, radiant heat may be evenly generated at the main surface 7a of wafer 7 opposite to inner wall face 2c.

Plate 4 is provided immediately under outlet 6. Plate 4 has ventilation holes 4a through which gas within chamber 8 is let into first gas path 2a. Ventilation holes 4a preferably have a fine size and are evenly provided at plate 4. Thus, gas within chamber 8 may be gradually let out while maintaining an appropriate air flow within chamber 8. Plate 4 is provided at a position as high as inner wall face 2c. Thus, radiant heat the same as the case of inner wall face 2c may be generated at main surface 7a positioned immediately under plate 4.

Exhaustion control valves 5a and 5b are provided to control the displacement of hot plate unit 1 within the range not less than 0.1 L/min to not more than 1 L/min. Thus setting the displacement within the above-described range could advantageously contribute to even baking of a wafer.

Figure 3:
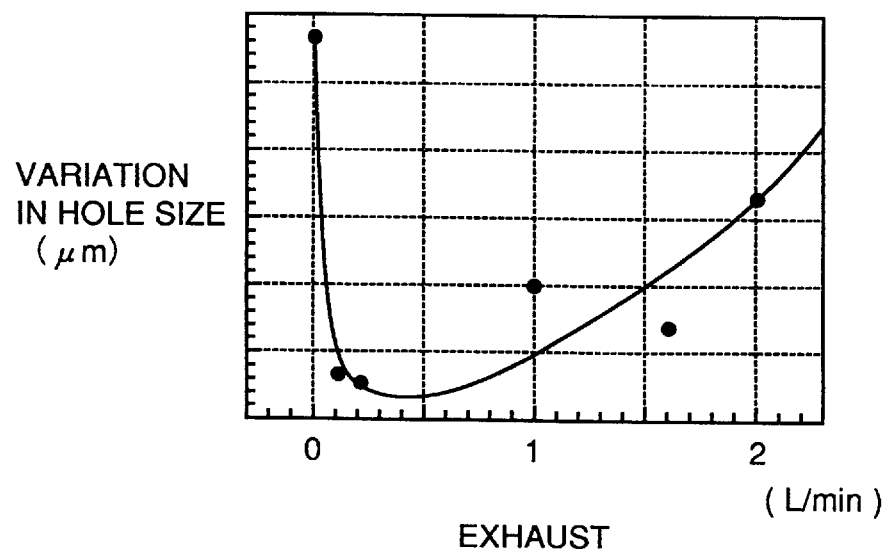
FIG. 3 is a graph showing the relation between the displacement of the hot plate unit according to the present invention and a variation in the hole size.
Figure 4:
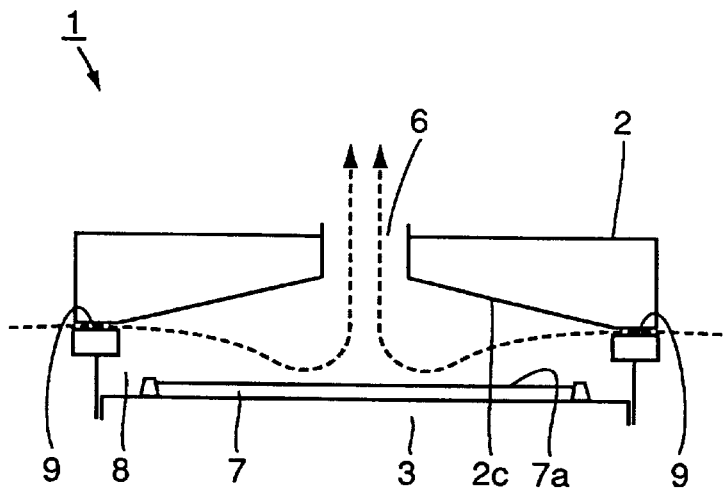
FIG. 4 is a cross sectional view schematically showing an example of a conventional hot plate unit.

FIG. 3 shows the relation between a variation in the hole size and displacement when a hole size reducing process is performed using a thermal flow, an example of a process sensitive to a heat treatment. As shown in FIG. 3, within the range of displacement not less than 0.1 L/min to not more than 1.0 L/min, the variation in the hole size is restricted. More specifically, this shows that the wafer is evenly baked.

Note that if the displacement is smaller than 0.1 L/min, it would be difficult to forcibly generate an air flow within chamber 8, which could lead to deposition of a sublimate in chamber 8. Thus, setting the displacement within the above-described range permits even baking of a wafer while restricting deposition of a sublimate within chamber 8.

Now, a method of baking using hot plate unit 1 shown in FIG. 1 will be described. Wafer 7 is placed on bake plate 3 in chamber 8 using robot arms or the like. Exhaustion control valves 5a and 5b are used to maintain the displacement of gas from chamber 8 in the above-described range, while wafer 7 is heated by bake plate 3. At the time, gas let into chamber 8 passes sequentially from second gas path 2b, chamber 8 and first gas path 2a according to the arrow in FIG. 1 and externally exhausted.

As shown in FIG. 1, second gas path 2b extends in adjacent to first gas path 2a and along the inner wall face 2c of cover 2. Gas let into second gas path 2b is therefore heated by both gas let out through first gas path 2a and inner wall face 2c. The gas thus heated is supplied into chamber 8 from the vicinity of the circumferential portion of chamber 8. As a result, wafer 7 can be effectively prevented from being cooled by external gas supply into chamber 8.

The gas sent into chamber 8 in the above-described manner has its displacement controlled at a very small level as described above by the function of displacement control valves 5a and 5b, is therefore made to gently flow toward the central portion from the circumferential portion of chamber 8, and let into first gas path 2a from ventilation hole 4a. Since the gas is made to gently flow within chamber 8, the evenness of an air flow on wafer 7 may be improved. This also contributes to even baking of the wafer.

As shown in FIG. 1, supplying gas from a plurality of positions into chamber 8 permits gas in chamber 8 to be more efficiently made to flow toward plate 4. Deposition of a sublimate in chamber 8 may therefore be effectively restricted. In addition, plate 4 and internal wall face 2c are both positioned opposite to the main surface 7a of wafer 7 at a prescribed distance therebetween, radiant heat may be evenly generated at the entire main surface 7a of wafer 7.

Figure 5:
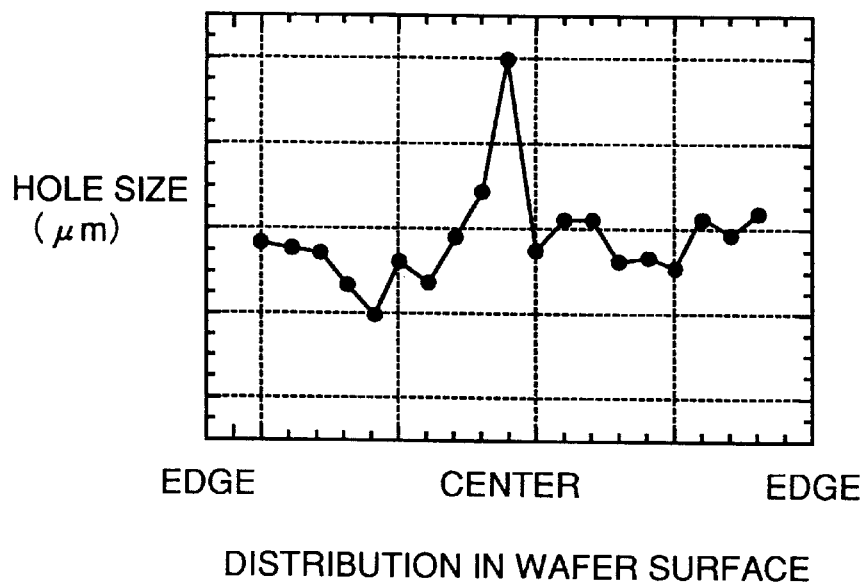
FIG. 5 is a graph showing a distribution of hole sizes at a main surface of a wafer when a hole size reducing process is performed using the hot plate unit shown in FIG. 4.

As in the foregoing, use of hot plate unit 1 as shown in FIG. 1 permits wafer 7 to be evenly baked. The inventors then performed a hole size reducing process using hot plate unit 1 shown in FIG. 1 in order to confirm the effects. The result is given in FIG. 2. As shown in FIG. 2, according to the present invention, a variation in the hole size is considerably smaller than a conventional case shown in FIG. 5. More specifically, use of hot plate unit 1 according to the invention permits wafer 7 to be evenly baked.

Note that in the embodiment shown in FIG. 1, gas is supplied from the side of second gas path 2b, but the gas may be supplied from the side of first gas path 2a. Furthermore, a mesh type member may be employed for plate 4. Also in this embodiment, hot plate unit 1 according to the invention is applied to a hole size reducing process taking advantage of a thermal flow of resist, which is a process sensitive to a heat treatment, but hot plate unit 1 may be used to various baking processes such as DH, AD, PB, PEB and PDB.

As described above, the semiconductor manufacturing device according to one embodiment of the invention permits radiant heat to be evenly generated at the main surface of a wafer, because the distance from the inner wall face of the cover and the member having the ventilation hole to the main surface of the wafer is fixed. Thus, the wafer may be evenly baked.

The semiconductor device according to another aspect of the invention, the displacement is adjusted to be considerably smaller than the conventional example. Thus, air flow within the chamber of the semiconductor manufacturing device may be even and gentle. This could also contribute to even baking of the wafer.

By the method of processing a wafer according to the present invention, a wafer is processed using the above-described semiconductor manufacturing device, and therefore the wafer may be evenly processed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor manufacturing device for baking a wafer, comprising:

a chamber;

a heating portion provided in said chamber, said wafer being placed thereon;

a cover comprising an inner wall face opposite to a main surface of said wafer, an inlet/outlet provided opposite the main surface of said wafer, and a member having a ventilation hole;

wherein the distance between the main surface of said wafer placed on said heating portion and said inner wall face is fixed;

wherein said cover defines a first gas path including said inlet/outlet, wherein said cover defines a second gas path adjacent at least a portion of said first gas path, wherein said member is provided within said first gas path such that a distance between said member and the main surface of said wafer is substantially identical to the distance between the inner wall face of said cover and the main surface of said wafer.

2. The semiconductor manufacturing device as recited in claim 1, wherein gas is input into said chamber through one of said first gas path and said second gas path defined by said cover, and said gas input into said chamber through one of said first gas path and said second gas path is heated by gas output from said chamber through another one of said first gas path and said second gas path.

3. The semiconductor manufacturing device as recited in claim 2, wherein said second gas path defined by said cover is provided adjacent at least a portion of the inner wall face of said cover.

4. A semiconductor manufacturing device for baking a wafer, comprising:

a chamber;

a heating portion provided in said chamber, said wafer being placed thereon;

a cover having an inner wall face opposite to a main surface of said wafer, the distance between the main surface of said wafer placed on said heating portion and said inner wall face being fixed;

an inlet/outlet provided at a position opposite to the main surface of said wafer for letting in/out gas; and a member having a ventilation hole and provided between said inlet/outlet and said wafer such that the distance between said member and the main surface of said wafer is substantially identical to the distance between the inner wall face of said cover and the main surface of said wafer, wherein said member is a plate having evenly provided said ventilation holes, and a circumferential portion of said member is connected with the inner wall face of said cover.

5. A method of processing a wafer, wherein a wafer is processed using the semiconductor manufacturing device as recited in claim 1.

6. The semiconductor manufacturing device for baking a wafer comprising:

a chamber;

a cover for said chamber, said cover being provided with an outlet for letting gas out of said chamber and a gas path adjacent and surrounding said outlet for letting gas into said chamber, at least one displacement control valve provided in communication with said gas path.

7. A semiconductor manufacturing device for baking a wafer according to claim 6, wherein said at least one displacement control valve controls displacement at a level in the range from at least 0.1 L/min to at most 1 L/min.

8. The semiconductor manufacturing device for baking a wafer according to claim 6, wherein said gas path adjacent and surrounding said outlet for letting gas into said chamber further comprising a plurality of gas paths for letting gas into said chamber.

* * * * *